United States Patent
Lee et al.

(10) Patent No.: US 7,141,494 B2
(45) Date of Patent: Nov. 28, 2006

(54) METHOD FOR REDUCING TUNGSTEN FILM ROUGHNESS AND IMPROVING STEP COVERAGE

(75) Inventors: Sang-Hyeob Lee, Fremont, CA (US); Karl B. Levy, Los Altos, CA (US); Aaron R. Fellis, San Jose, CA (US); Panya Wongsenakhum, Fremont, CA (US); Juwen Gao, Fremont, CA (US); Joshua Collins, Sunnyvale, CA (US); Kaihan A. Ashtiani, Sunnyvale, CA (US); Junghwan Sung, Los Altos, CA (US); Lana Hiului Chan, Santa Clara, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/649,351

(22) Filed: Aug. 26, 2003

(65) Prior Publication Data
US 2005/0031786 A1  Feb. 10, 2005

Related U.S. Application Data

(63) Continuation-in-part of application No. 09/975,074, filed on Oct. 9, 2001, now Pat. No. 6,635,965.

(60) Provisional application No. 60/292,917, filed on May 22, 2001.

(51) Int. Cl.
*H01L 21/4763* (2006.01)
*H01L 21/44* (2006.01)

(52) U.S. Cl. .................... 438/627; 438/677; 438/680; 438/685; 438/902

(58) Field of Classification Search ................ 438/685, 438/679–681, 761
See application file for complete search history.

(56) References Cited

U.S. PATENT DOCUMENTS

| 4,804,560 A | 2/1989 | Shioya et al. |
|---|---|---|
| 5,028,565 A | 7/1991 | Chang et al. |
| 5,227,329 A | 7/1993 | Kobayashi et al. |
| 5,250,329 A | 10/1993 | Miracky et al. |
| 5,326,723 A | 7/1994 | Petro et al. |
| 5,391,394 A | 2/1995 | Hansen |
| 5,661,080 A | 8/1997 | Hwang et al. |
| 5,726,096 A | 3/1998 | Jung |

(Continued)

FOREIGN PATENT DOCUMENTS

WO  WO01/27347  4/2001

OTHER PUBLICATIONS

Klaus et al., "Atomically Controlled Growth of Tungsten and Tungsten Nitride Using Sequential Surface Reactions," Applied Surface Science, 162-163, (2000) 479-491.

(Continued)

*Primary Examiner*—Michael Lebentritt
*Assistant Examiner*—Cheung Lee
(74) *Attorney, Agent, or Firm*—Beyer Weaver & Thomas LLP.

(57) ABSTRACT

A tungsten nucleation film is formed on a surface of a semiconductor substrate by alternatively providing to that surface, reducing gases and tungsten-containing gases. Each cycle of the method provides for one or more monolayers of the tungsten film. The film is conformal and has improved step coverage, even for a high aspect ratio contact hole.

32 Claims, 8 Drawing Sheets

U.S. PATENT DOCUMENTS

| | | | |
|---|---|---|---|
| 5,795,824 | A | 8/1998 | Hancock |
| 5,804,249 | A | 9/1998 | Sukharev et al. |
| 5,817,576 | A | 10/1998 | Tseng et al. |
| 5,956,609 | A * | 9/1999 | Lee et al. ............. 438/627 |
| 6,001,729 | A | 12/1999 | Shinriki et al. |
| 6,017,818 | A | 1/2000 | Lu |
| 6,066,366 | A | 5/2000 | Berenbaum et al. |
| 6,099,904 | A | 8/2000 | Mak et al. |
| 6,107,200 | A * | 8/2000 | Takagi et al. ............. 438/685 |
| 6,143,082 | A | 11/2000 | McInerney et al. |
| 6,174,812 | B1 | 1/2001 | Hsiung et al. |
| 6,245,654 | B1 | 6/2001 | Shih et al. |
| 6,265,312 | B1 | 7/2001 | Sidhwa et al. |
| 6,294,468 | B1 | 9/2001 | Gould-Choquette et al. |
| 6,297,152 | B1 | 10/2001 | Itoh et al. |
| 6,309,966 | B1 | 10/2001 | Govindarajan et al. |
| 6,355,558 | B1 | 3/2002 | Dixit et al. |
| 6,551,929 | B1 | 4/2003 | Kori et al. |
| 6,566,250 | B1 | 5/2003 | Tu et al. |
| 6,566,262 | B1 | 5/2003 | Rissman et al. |
| 6,607,976 | B1 | 8/2003 | Chen et al. |
| 6,635,965 | B1 | 10/2003 | Lee et al. |
| 6,706,625 | B1 | 3/2004 | Sudijono et al. |
| 6,740,585 | B1 | 5/2004 | Yoon et al. |
| 6,844,258 | B1 | 1/2005 | Fair et al. |
| 6,861,356 | B1 | 3/2005 | Matsuse et al. |
| 6,962,873 | B1 | 11/2005 | Park |
| 2001/0008808 | A1 | 7/2001 | Gonzalez |
| 2001/0014533 | A1 | 8/2001 | Sun |
| 2001/0015494 | A1 | 8/2001 | Ahn |
| 2001/0044041 | A1 | 11/2001 | Badding et al. |
| 2002/0090796 | A1 | 7/2002 | Desai et al. |
| 2002/0177316 | A1 | 11/2002 | Miller et al. |
| 2003/0059980 | A1 | 3/2003 | Chen et al. |
| 2003/0104126 | A1 * | 6/2003 | Fang et al. ........... 427/255.392 |
| 2003/0127043 | A1 | 7/2003 | Lu et al. |
| 2004/0044127 | A1 | 3/2004 | Okubo et al. |
| 2004/0206267 | A1 | 10/2004 | Sambasivan et al. |

OTHER PUBLICATIONS

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomically controlled growth of Tungsten and Tungsten nitride using sequential surface reactions", Applied Surface Science, 162-163 (2000) 479-491.

Klaus et al., "Atomic layer deposition of tungsten using sequential surface chemistry with a sacrificial stripping reaction", Thin Solid Films 360 (2000) 145-153.

Levy et al., U.S. Appl. No. 10/690,492, filed Oct. 20, 2003, Office Action dated Mar. 23, 2005.

Lee et al., PCT Search Report, Completed Oct. 15, 2004, PCT/US2004/006940, Int'l filing date May 3, 2004.

Lee et al., Written Opinion, Completed Oct. 15, 2004, PCT/US2004/006940, Int'l filing date May 3, 2004.

U.S. Office Action mailed Jul. 12, 2005, from U.S. Appl. No. 10/815,560.

Wongsenakhum et al., "Method of Forming Low-Resistivity Tungsten Interconnects", Novellus Systems, Inc., filed Mar. 31, 2004, U.S. Appl. No. 10/815,560, pp. 1-30.

U.S. Office Action mailed Jul. 17, 2002, from U.S. Appl. No. 09/975,074.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

U.S. Office Action mailed Jun. 22, 2004, from U.S. Appl. No. 10/435,010.

Levy e al., "Deposition of Tungsten Nitride", Novellus Systems, Inc., filed Oct. 20, 2003, U.S. Appl. No. 10/690,492, pp. 1-42.

Fair et al., "Selective Refractory Metal and Nitride Capping", Novellus Systems, Inc., filed Nov. 8, 2004, U.S. Appl. No. 10/984,126, pp. 1-22.

U.S. Office Action mailed Nov. 8, 2004, from U.S. Appl. No. 10/984,126.

Chan et al., "Methods for Growing Low-Resistivity Tungsten Film", Novellus Systems, Inc., filed Nov. 1, 2005, U.S. Appl. No. 11/265,531, pp. 1-35.

Levy et al., "Deposition of Tungsten Nitride", Novellus Systems, Inc., filed Dec. 16, 2005, U.S. Appl. No. 11/305,368, pp. 1-39.

U.S. Office Action mailed Dec. 28, 2005, from U.S. Appl. No. 10/815,560.

U.S. Office Action mailed Apr. 17, 2006, from U.S. Appl. No. 10/815,560.

Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.

U.S. Office Action mailed May 17, 2006, from U.S. Appl. No. 10/984,126.

* cited by examiner

METHOD FOR REDUCING TUNGSTEN FILM ROUGHNESS AND IMPROVING STEP COVERAGE

CROSS-REFERENCE TO RELATED PATENT APPLICATIONS

This application is a continuation in part of U.S. patent application Ser. No. 09/975,074 by Lee et al., filed Oct. 9, 2001 now U.S. Pat. No. 6,635,965 and titled "METHOD FOR PRODUCING ULTRA-THIN TUNGSTEN LAYERS WITH IMPROVED STEP COVERAGE," which in turn claims priority from U.S. Provisional Patent Application No. 60/292,917, filed May 22, 2001, by Lee et al., and titled "ULTRA THIN TUNGSTEN LAYER WITH IMPROVED STEP COVERAGE." Both prior applications are incorporated herein by reference for all purposes.

FIELD OF THE INVENTION

The present invention relates to formation of tungsten films on a semiconductor substrate.

BACKGROUND OF THE INVENTION

The deposition of tungsten (W) films using chemical vapor deposition (CVD) techniques is an integral part of many semiconductor fabrication processes since it can produce low resistivity electrical connection between (i) adjacent metal layers (vias) and (ii) first metal layer and the devices on the silicon substrate (contact). In one tungsten deposition process, the wafer is heated to the process temperature in a vacuum chamber, and then a thin layer of tungsten film, known as the seed or nucleation layer, is deposited. Thereafter, the via or contact is filled with tungsten by the reduction of tungsten hexafluoride ($WF_6$) by hydrogen ($H_2$) ("plugfill" or the "bulk layer"). The bulk layer is generally deposited more rapidly than the nucleation layer, but cannot be produced easily and reliably without first forming the nucleation layer.

Various deposition methods can be used to form a thin tungsten nucleation layer. These include a chemical vapor deposition (CVD) and a pulsed nucleation layer (PNL) technique.

In the chemical vapor deposition (CVD) technique, the $WF_6$ and reducing gas (e.g., $SiH_4$ and/or $H_2$) are simultaneously introduced into the reaction chamber. This produces a continuous chemical reaction of mix reactant gases that continuously forms tungsten film on the substrate surface. In a typical example, CVD nucleation layers are deposited from WF6-SiH4 with an Ar-H2 carrier gas. In some instances, CVD nucleation performance is enhanced by the presence of H2 in carrier gas mixture. Note that the WF6-SiH4 reaction is much faster than the WF6-H2 reaction due to lower activation energy and greater reactivity. WF6 will preferentially react with SiH4 and not start reacting with H2 until the SiH4 is gone.

In the pulsed nucleation layer deposition (PNL) technique, pulses of the reducing agent, purge gases, and metal-containing oxidizing agents are sequentially injected into and purged from the reaction chamber. The process is repeated in a cyclical fashion until the desired thickness is achieved. This process is described in U.S. patent application Ser. No. 09/975,074, previously incorporated by reference. PNL is similar to atomic layer deposition techniques reported in the literature. PNL is generally distinguished from ALD by its higher operating pressure range (greater than 1 Torr) and its higher growth rate per cycle (greater than 1 monolayer film growth per cycle). In the context of this invention, PNL broadly embodies any cyclical process of sequentially adding reactants for reaction on a semiconductor substrate. Thus, the concept embodies techniques conventionally referred to as ALD.

One important benefit of the PNL tungsten deposition process is a reduction in tungsten film roughness of up to ten times compared to tungsten grown with a CVD nucleation layer. Roughness is important for enhanced plugfill because a smooth film will create a smooth seam during the final stages of contact plugfill. Rougher tungsten films are undesirable because they tend to block closing seams with protruding tungsten grains and trap large void areas inside the feature. The seams produced during the final stage of plugfill can be exposed during tungsten chemical mechanical polishing (CMP) or etchback and result in significant integration problems for subsequent deposition steps such as copper barrier-seed and electroplating.

Other benefits of PNL tungsten deposition include (a) superior step coverage in comparison to CVD, (b) liner barrier insensitivity (PNL tungsten can integrate well with a large variety of Ti—TiN films), and (c) improved throughput in comparison to many conventional ALD processes due to multiple growth layers per cycle.

Improved methods for rapidly depositing smooth tungsten layers for plugfill would benefit the IC fabrication industry.

SUMMARY OF THE INVENTION

The present invention provides methods of forming tungsten films, and particularly films including a tungsten nucleation layer, on semiconductor substrates. In one embodiment, the methods emphasize the use of nitrogen during the deposition process. As an example, such methods may involve the following operations: (a) depositing a tungsten nucleation layer on the semiconductor substrate by contacting the semiconductor substrate with a tungsten-containing gas and a reducing agent in the presence of nitrogen; and (b) depositing a tungsten bulk layer on the tungsten nucleation layer by a CVD process in which the semiconductor substrate is exposed to nitrogen. As a further example, either (a) or (b) can employ nitrogen as a process gas in a concentration of between about 1 and 20% by volume of the total gas flow to the semiconductor substrate (more preferably between about 1 and 10% by volume). In some cases, operation (a) employs a pulsed nucleation layer (PNL) process to deposit the nucleation layer.

In another aspect of the invention, the deposition method forms the tungsten film in a process employing at least three separate deposition operations: (a) depositing a tungsten nucleation layer on the semiconductor substrate; (b) depositing a tungsten bulk layer on the nucleation layer using a chemical vapor deposition (CVD) process; and (c) depositing a tungsten cap layer on the tungsten bulk layer using a pulsed nucleation layer (PNL) deposition technique. Operations (b) and (c) may be repeated multiple times to create a film of the desired thickness which possesses the high growth rate and low resistivity of CVD-W and the excellent step coverage and smoothness of PNL-W.

In yet another aspect of the invention, the deposition method forms a boron layer on the semiconductor substrate to begin the deposition process. This has been found to reduce the sensitivity of PNL tungsten deposition processes to variations in the surface conditions of the semiconductor substrates. The boron process may be characterized by the following operations: (a) forming a boron layer on the semiconductor substrate; (b) contacting the boron layer with a tungsten-containing gas to thereby reduce the tungsten-containing gas to a tungsten layer on the semiconductor substrate; (c) contacting the semiconductor substrate with a reducing agent to form a layer of reducing agent; and (d) contacting the layer of reducing agent with the tungsten-containing gas to thereby reduce the tungsten-containing gas to another tungsten layer on the semiconductor substrate. Operations (c) and (d) may be repeated for multiple cycles. The boron layer formed in (a) can be deposited at any thickness, as its deposition is not a self-limiting process. But preferably it is maintained as a relatively thin layer. In some embodiments, the reducing agent employed in (c) is a silane or other material that adsorbs on the semiconductor substrate in a self-limiting manner.

Other process operations that may be included in the above methods include positioning the semiconductor substrate at a deposition station within a single or multi-station deposition chamber; and heating the semiconductor substrate to a temperature between approximately 250 and 475° C., for example, at the deposition station. In addition, after contacting the substrate with a reducing agent and/or tungsten-containing gas, the deposition chamber may be purged of such gases.

Examples of reducing gases include $SiH_4$, $Si_2H_6$, $H_2$, $B_2H_6$, $SiH_2Cl_2$ and combinations thereof. The reducing gas may further include a noble gas, hydrogen, nitrogen, or a combination thereof. Examples of tungsten-containing gases include $WF_6$, $WCl_6$, $W(CO)_6$ and mixtures thereof. The tungsten-containing gas may further include a noble gas, hydrogen, nitrogen, or a mixture thereof.

The above methods can be repeated until the desired thickness of tungsten is obtained and/or may include further steps to produce a desired IC.

These and other features and advantages of the present invention are described below with reference to the associated drawings.

BRIEF DESCRIPTION OF THE DRAWINGS

Panel A of FIG. 1 illustrates the relationship between nucleation layer film thickness and number of PNL cycles at temperatures ranging from 150 to 450° C. with dosing of 40 sccm of $SiH_4$ for 2 seconds and 600 sccm of $WF_6$ for 2 seconds. Panel B of FIG. 1 shows the relationship between growth rate and number of cycles under similar process parameters.

DETAILED DESCRIPTION OF THE INVENTION

Figure 1:
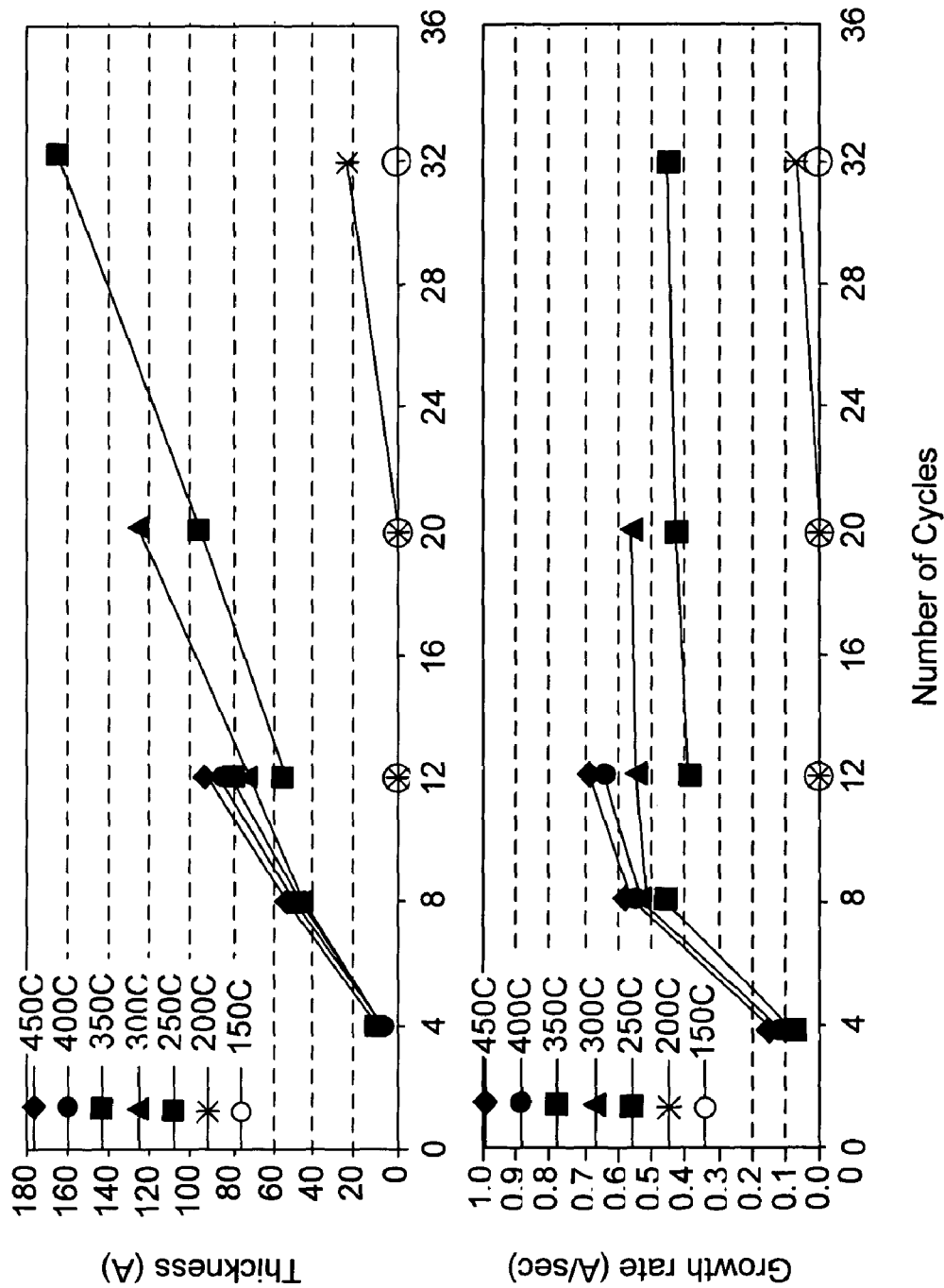

Embodiments of the present invention will be described with reference to the aforementioned figures. These figures are simplified for ease of understanding and description of embodiments of the present invention only. Modifications, adaptations or variations of specific methods and or structures shown and discussed herein may become apparent to those skilled in the art. All such modifications, adaptations or variations that rely upon the teachings of the present invention, and through which these teachings have advanced the art, are considered to be within the spirit and scope of the present invention.

Introduction

The present invention provides improved methods of forming a tungsten layer on a semiconductor substrate. It accomplishes this by use of various techniques to control the tungsten deposition process. These include use of nitrogen as a process gas to control nucleation of tungsten, alternating PNL and CVD to form a tungsten layer, and use of a boron sacrificial layer to react with a tungsten precursor. Before these various techniques are described in detail, some features of a suitable PNL process will be presented.

PNL produces conformal tungsten nucleation layers by sequentially depositing a plurality of very thin tungsten sub-layers, each of about one or more tungsten monolayers in thickness, on a semiconductor substrate by sequentially injecting and removing reactants into and from a chamber. In one embodiment, the PNL method includes the following operations: (a) positioning the semiconductor substrate at a deposition station within a deposition chamber; (b) heating the semiconductor substrate to a temperature appropriate for the PNL method at the deposition station; (c) flowing a reducing gas into said deposition chamber whereby about one or more monolayers of the reducing gas are deposited (or adsorbed) onto said surface of the substrate; and (d) flowing a tungsten-containing gas into said deposition chamber. The reducing gas reacts with the tungsten-containing gas to form a tungsten layer, or more properly a tungsten sub-layer of a multi sub-layer tungsten film. Commonly, the method also includes purging the reducing gas from the deposition chamber prior to introduction of the tungsten-containing gas. It may additionally include a purge following introduction of the tungsten-containing gas, (d). Generally, the method includes multiple cycles of flowing reducing gas, purging, flowing tungsten-containing precursor, and purging. Each cycle deposits a thin sub-layer of the tungsten film. The process continues until the total thickness of the tungsten film reaches a desired level.

In a preferred embodiment, the pressure of the deposition chamber during PNL is maintained at about 1 to 300 Torr, more preferably about 20 to 60 Torr. And preferably, the temperature of the substrate during PNL is maintained at about 200 to 475° C., and more preferably at about 250 to 350° C.

Prior to the pulsed nucleation process, the semiconductor substrate, optionally, is exposed to a gas, which promotes growth of tungsten with no nucleation delay. This step, which is called an "initiation soak" step, comprises exposure of the substrate to a gas such as $SiH_4$, $B_2H_6$, $Si_2H_6$, $H_2$, Ar, $N_2$, or $O_2$, or a combination thereof, in a gaseous or plasma state for about 1 to about 60 seconds. The plasma state can be produced using a radio frequency or microwave energy source. This serves to precondition the substrate surface. As explained elsewhere herein, an example of a soak step is a single $B_2H_6$—Ar (or Ar—$H_2$) pulse prior to $WF_6$—$SiH_4$ PNL. This establishes a layer of reducing agent (boron) on the wafer surface, which can reduce or eliminate nucleation delays by providing an optimal surface for tungsten nucleation more or less regardless of the condition of the adhesion layer applied during prior processing of the wafer (typically a Ti—TiN layer). In the absence of a $B_2H_6$ soak step, a process may use an extra-long initial $SiH_4$ dose, which would function just like a soak step. Note that the soak can be viewed as an initial cycle. As such, it should be noted that the invention contemplates processes in which dose times are modified a function of cycle number. In a specific example, a long initial $SiH_4$ or $B_2H_6$ dose is employed to improve nucleation density (number of nuclei per unit area) and to reduce nucleation delay.

Various reducing agents such as $SiH_4$, $B_2H_6$, $Si_2H_6$, $SiH_2Cl_2$, or $H_2$, or a combination thereof, can be used for the pulsed nucleation process. In one example, the reducing gas comprises a silane such as $SiH_4$ along with an inert carrier gas such as argon or an argon-hydrogen carrier gas mixture. In some exemplary processes performed on 300 mm wafers and using a conventional CVD reactor, the reducing gas is supplied at a flow rate of approximately 100 to 400, and more preferably, approximately 100 to 200, and most preferably about 200 standard cubic centimeters per second (sccm). This flow is continued for a predetermined time, typically about 5 seconds or less and preferably, about 1–2 seconds, and the flow of reducing gases is stopped. A gas line charge time of about 0.5 seconds may be used to pressurize the gas flow lines leading to the deposition chamber prior to release of the gas into the chamber. Upon completion of the reducing gas flow time in the chamber, the gas line to the chamber is closed and then evacuated for about 0.5 seconds by utilization of a rough pump line. This is the gas line purge time. The line charge and purge times of the reducing gas can be overlapped with the chamber purge times.

Typically, the reaction chamber is purged prior to beginning the flow of the tungsten-containing gases. Purging preferably is accomplished by introduction of a noble gas, or nitrogen, or hydrogen, or a mixture thereof into the deposition chamber at fixed pressure and/or the vapor phase in the deposition chamber is by reducing the pressure of the deposition chamber from its set-point during the reagent dose step and then re-pressurizing the deposition chamber prior to the start of the following reagent dose step.

Various tungsten-containing gases including, but not limited to, $WF_6$, $WCl_6$, and $W(CO)_6$ can be used for the pulsed nucleation process. Preferably, the tungsten-containing gas comprises $WF_6$ along with nitrogen or an inert carrier gas. In a typical reactor using a typical 300-mm substrate, the tungsten-containing gas flow rate is between approximately 200 to 900 sccm per deposition station; preferably, between about 200 and 400 sccm per deposition station, and most preferably, at about 300 sccm per deposition station. Note that gas flows are typically scaled with the surface area of the wafer being deposited on and that the specific case of 300-mm wafers is strictly for illustrative purposes. This flow is continued for a predetermined time, typically about 5 seconds or less and preferably, about 2 seconds, and the flow of reducing gases is stopped. Generally, a line charge of about 0.5 to 1.5 seconds is used. Upon completion of the tungsten-containing gas flow time in the chamber, the gas line to the chamber is closed and then evacuated for about 0.5 seconds by utilization of a rough pump line. This is the gas line purge time. The line charge and purge times of the tungsten-containing gas can be overlapped with the chamber purge times. It has been found that tungsten deposition occurs only on the surface where reducing gas has been absorbed.

It will be understood that a noble gas such as argon or another gas such as nitrogen or hydrogen, or a combination thereof may be provided as the "background gas" to the deposition station simultaneously with the reducing gases or the tungsten-containing gases. In some embodiments, the flow of the background gases is continuous, i.e., it is not switched on and off as are the tungsten-containing gas and the reducing gas. In this manner the background gas can serve as the purge gas as well.

Using PNL as described herein, the growth rate of tungsten per cycle is typically between about 8 and 12 Angstroms, and preferably between about 10 and 12 Angstroms per cycle as compared to a growth rate of less than 2.5 A that can be achieved using the conventional ALD processes.

The tungsten film resulting from PNL processes such as those described herein may be used as a conformal nucleation layer (or "cap layer" as described below) in contacts and/or vias. Using PNL methods described herein, nucleation layers having a step coverage of greater than 75%; preferably, greater than 80%; and more preferably, greater than 90% can be achieved. In addition, this level of step coverage can be repeatedly and routinely produced in even high aspect ratio contacts, including, but not limited to contacts have an aspect ratio of greater than 10:1, or even 20:1 or greater.

Panel A of FIG. 1 illustrates the relationship between nucleation layer film thickness and number of PNL cycles. Panel B of FIG. 1 shows the relationship between growth rate and number of cycles. The depositions were done at a substrate temperature of between 250 and 350° C. The nucleation layers will generally have a thickness of greater than about 25 Angstroms; and preferably, between about 25 and about 100 Angstroms.

Figure 2:
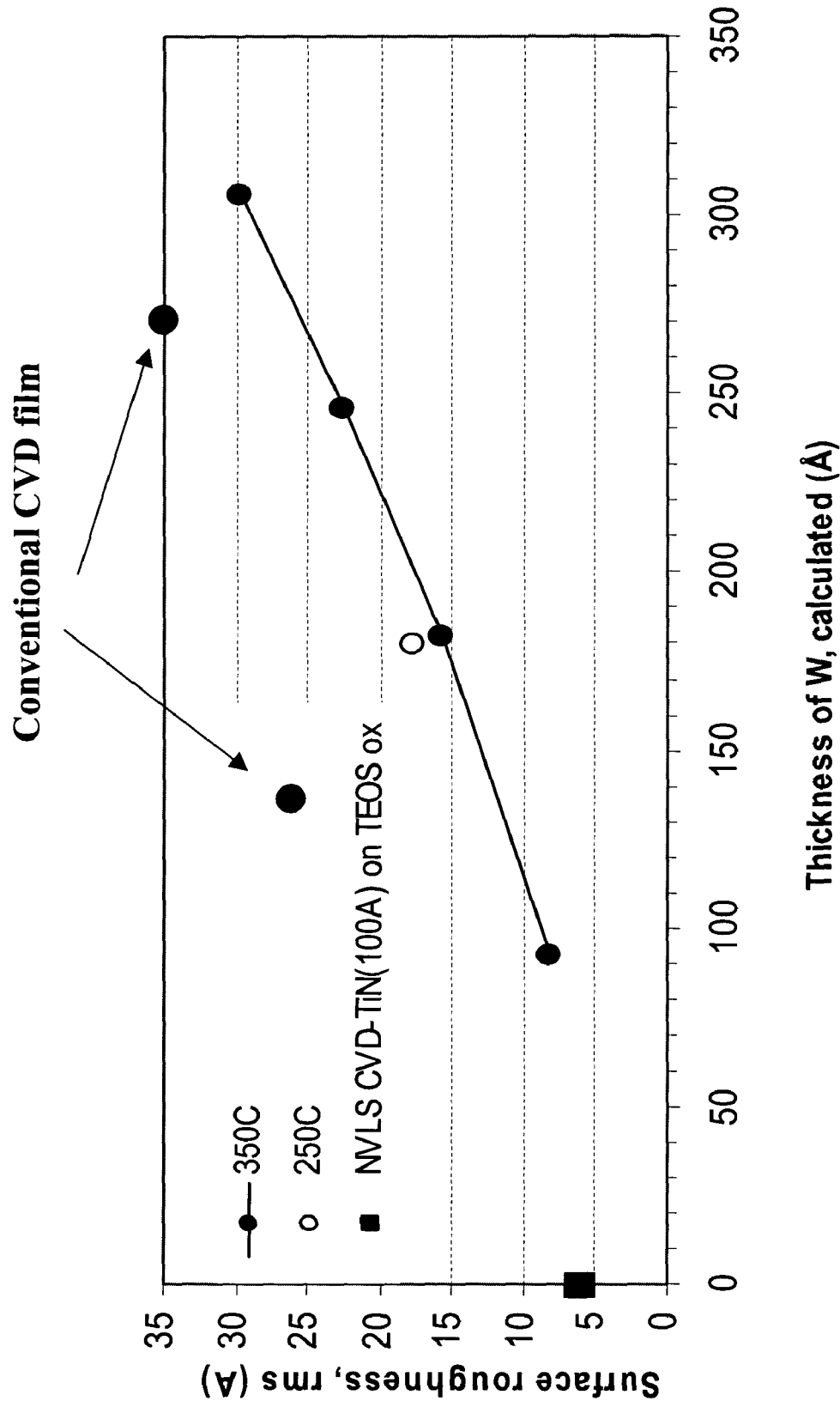
FIG. 2 shows the relationship of surface roughness, measured in Angstroms with thickness of the pulsed nucleation layer for nucleation layers produced by conventional CVD technology (large dark circles); pulsed nucleation technology at 350° C. (small dark circles); pulsed nucleation technology at 250° C. (hollow circles) and a semiconductor substrate comprising CVD-TiN (100 Angstroms) on TEOS oxide (squares).

As shown in FIG. 2, the pulsed nucleation layers produced by the methods described herein are substantially less rough (and have a smaller grain size), as measured by atomic force microscopy, than tungsten films produced by conventional CVD.

In some embodiments, reagent gasses are alternated as a function of cycle number as is the carrier gas mixture varied as a function of cycle number. In a specific example, carrier gases are modified in a manner whereby the carrier gas includes only argon for one or more cycles to strictly avoid any CVD component of the initial nucleation process, and then the carrier gas is modified by introducing nitrogen into the mixture only after one or more monolayers of tungsten have been deposited to fully coat the surface but before the desired total nucleation film thickness has been deposited. As discussed elsewhere herein, nitrogen will inhibit tungsten nucleation and can lead to spotty nucleation and rough films if applied too early. When applied later, nitrogen can actually reduce the roughness of the final film by slowing the growth of large tungsten grains.

A representative tungsten nucleation layer of 100 Angstroms thickness with step coverage of 96% in contacts with an aspect ratio of 12:1 can be produced on 300-mm silicon wafers as follows:

Preheat 10 seconds $SiH_4$ 200 sccm per deposition station for 2 seconds $WF_6$ 300 sccm per deposition station for 2 seconds Hydrogen 4750 sccm per deposition station flowing continuously Argon 13000 sccm per deposition station flowing continuously 14 cycles steps at 300° C.

The purging step between the alternating tungsten and reducing agent dosing may be performed by introducing a noble gas, hydrogen, or nitrogen into the deposition chamber. (or an combination of the above)

In many embodiments, the pulsed nucleation process is followed by more conventional bulk deposition of CVD-W using $H_2$ and/or $SiH_4$ with $WF_6$ (or another tungsten-containing gas) in a CVD process. Thus, the methods of the invention can include an operation of depositing tungsten film by CVD atop the nucleation layer by contacting the nucleation layer with $SiH_4$ and/or $H_2$ simultaneously with $WF_6$ under suitable conditions to deposit a tungsten film.

Furthermore, a soak operation (as described above) can be implemented subsequent to the pulsed nucleation process and prior to the CVD process. The soak operation can comprise exposing the substrate to a gas such as $N_2$, $H_2$, $O_2$, $Si_2H_6$, $B_2H_6$, or a combination thereof in a gaseous or plasma state.

If a multi-station reactor that enables parallel processing of multiple wafers is used, the alternating reactant deposition process may occur on some stations, simultaneous $WF_6$—$SiH_4$ CVD on other stations after completion of the alternating deposition process, and then simultaneous $WF_6$—$H_2$ CVD on the final deposition stations for complete tungsten fill.

More specifically, wafers that had been subjected to the pulsed alternating deposition methods described herein at the first 1, 2, 3, or more stations of the multi-station deposition system are then moved to a station wherein tungsten is deposited by the reaction of $WF_6$ and $H_2$. The $WF_6$ and $H_2$ gases are simultaneously introduced to achieve excellent gap-fill by chemical vapor deposition at higher rates (See U.S. Pat. No. 5,795,824 issued to Hancock on Aug. 18, 1998, which is incorporated herein by reference for all purposes). In addition, inert gases can be flowed to the deposition stations. When such a multi-station system is used, the deposition temperatures can be independently optimized for the alternating-process deposition described herein or for subsequent steps involving $WF_6$—$SiH_4$ CVD and/or $WF_6$—$H_2$ CVD. This process can be performed on some but not all of the pedestals of the multi-station system with hydrogen and $WF_6$ gases flowing simultaneously onto the other pedestals.

As one of skill will appreciate, this process can be performed with continuous noble gas, hydrogen, and/or nitrogen flow during both dosing and purging As one of skill may appreciate, it may be advantageous to have an additional $SiH_4$ dose step after the final dosing with the tungsten-containing gases to protect subsequent layers from residual tungsten residue in the chamber.

According to another aspect of the invention, the pulsed nucleation layers of the invention can serve as a seed layer for subsequent deposition of Cu or other metals. Note also that PNL-W can be a barrier for copper diffusion in the case of a thin W layer under a deposited or electroplated Cu film.

PNL-W itself requires an adhesion layer to stick to most dielectrics of interest in semiconductor devices. That adhesion layer can be provided by TiN, Ti(Si)N, WN, W(Si)N, W(C)N, or others. In the case of a layered Cu barrier including PNL-W, vacuum integration of the different layers can be important. This integration can be achieved by multiple deposition stations in a single chamber or by mounting multiple chambers on a single vacuum wafer handling system. Having a barrier with multiple layers can result in improved barrier properties because diffusing species have to fight their way across the interfaces between the layers. In the case of copper, having metallic W at the interface is better for Cu adhesion and also for direct electroplating than having a metal nitride at the interface.

Further, it will be recognized by those skilled in the art that a variety of techniques of forming interconnect, such as the single or dual damascene technique, or other traditional techniques of forming low resistance contacts or plugs which involve filling an opening with conductive materials such as tungsten or aluminum may be used to practice the present invention. Moreover, it should be understood that the present invention is applicable to forming a seed layer in a contact and/or a via atop a conductive or a doped region formed on a semiconductor substrate.

Addition of Nitrogen During PNL and/or CVD for Tungsten Roughness Reduction

One aspect of the present invention provides a method for improving tungsten roughness and step coverage by adding nitrogen to the process gases flowing in the reactor. Nitrogen addition can reduce the roughness of both PNL-W tungsten nucleation and WF6-$H_2$ CVD tungsten films. While not wishing to be bound by theory, it appears nitrogen functions by suppressing tungsten nucleation on certain sites on a growing tungsten surface. In particular, nucleation of new tungsten grains with WF6-$H_2$ CVD appears to be strongly suppressed on nitrogen-exposed tungsten.

In one embodiment, a tungsten deposition method of this invention includes an operation of flowing nitrogen gas into the reaction chamber. The nitrogen gas can be flowed into the chamber before, at the same time, or after the substrate is positioned on the chamber and heated to temperature. It can be flowed before, at the same time, or after the reaction gases enter the reaction chamber. It can also be flowed in a pulsing method that synchronizes with the reaction gases that enter the reaction chamber. In a preferred embodiment, the nitrogen is flowed after the semiconductor substrate is positioned in the reaction chamber and heated to the processing temperature and after the reducing gas or gases of the pulsed nucleation process enter the chamber.

The nitrogen can be shut off before, at the same time, or after all the pulsed nucleation process cycles are completed. In a preferred embodiment employing multiple deposition stations, the nitrogen is shut off before the last pulsed nucleation process cycle. Because nitrogen can prevent tungsten nucleation if applied before tungsten deposition starts, it can be important to let tungsten deposition start without nitrogen. This can generate a large number of tungsten nuclei per unit area of the exposed semiconductor substrate. Nitrogen flow can begin after tungsten deposition establishes a set of tungsten nuclei on the surface and stop before the deposition stops. If nitrogen continues to flow after the end of deposition at a first station of a multi-deposition station, it will then poison the beginning of W deposition after that wafer is indexed to a second station. Note that nitrogen application after W deposition is not intrinsically harmful, but in one implementation of multiple deposition stations in a single chamber, nitrogen flowing after deposition stops at one station will be the same as nitrogen flowing before deposition at the following station.

Figure 3A:
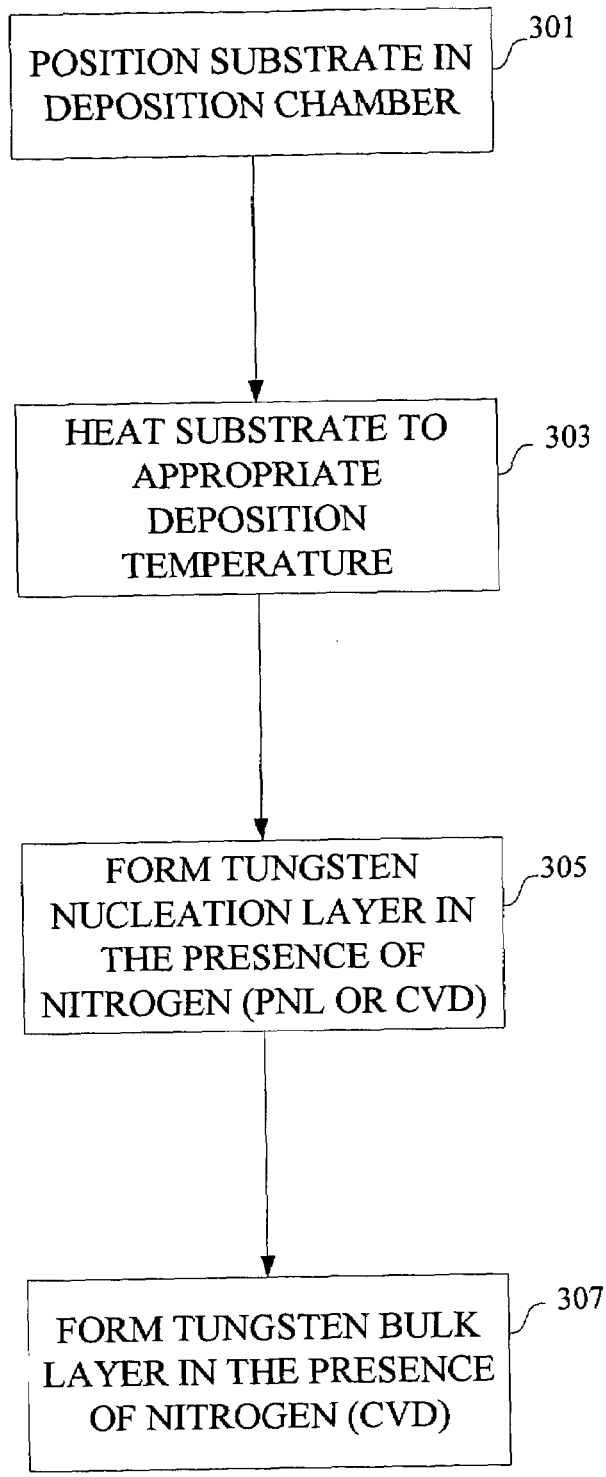
FIG. 3A is a process flow chart of a method, in accordance with an embodiment of this invention, in which nitrogen gas is used to facilitate deposition of the tungsten nucleation layer and the tungsten bulk layer.
Figure 3:
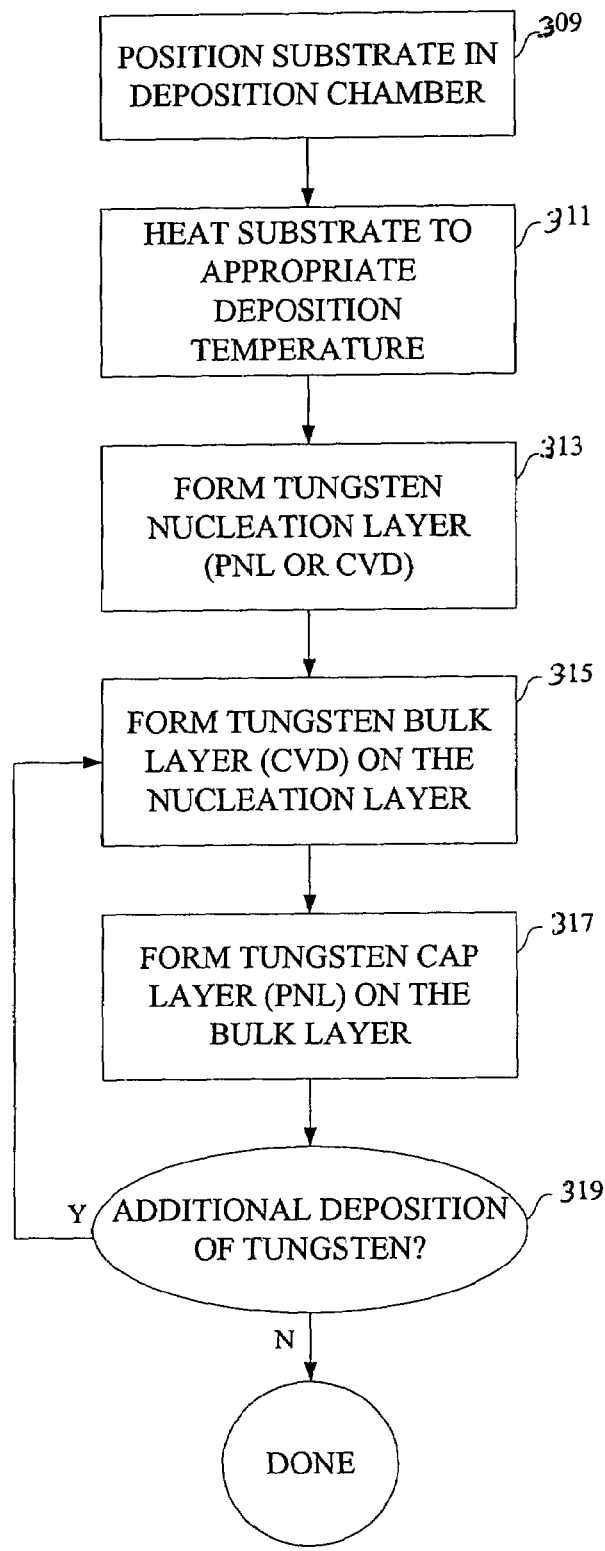
FIG. 3B is a process flow chart of a method, in accordance with an embodiment of this invention, in which the roughness of the tungsten film is controlled by alternating deposition of tungsten by CVD and PNL.
FIG. 3C is a process flow chart of a method, in accordance with an embodiment of this invention, in which a boron sacrificial layer is initially deposited to begin the tungsten deposition process.
Figure 3:
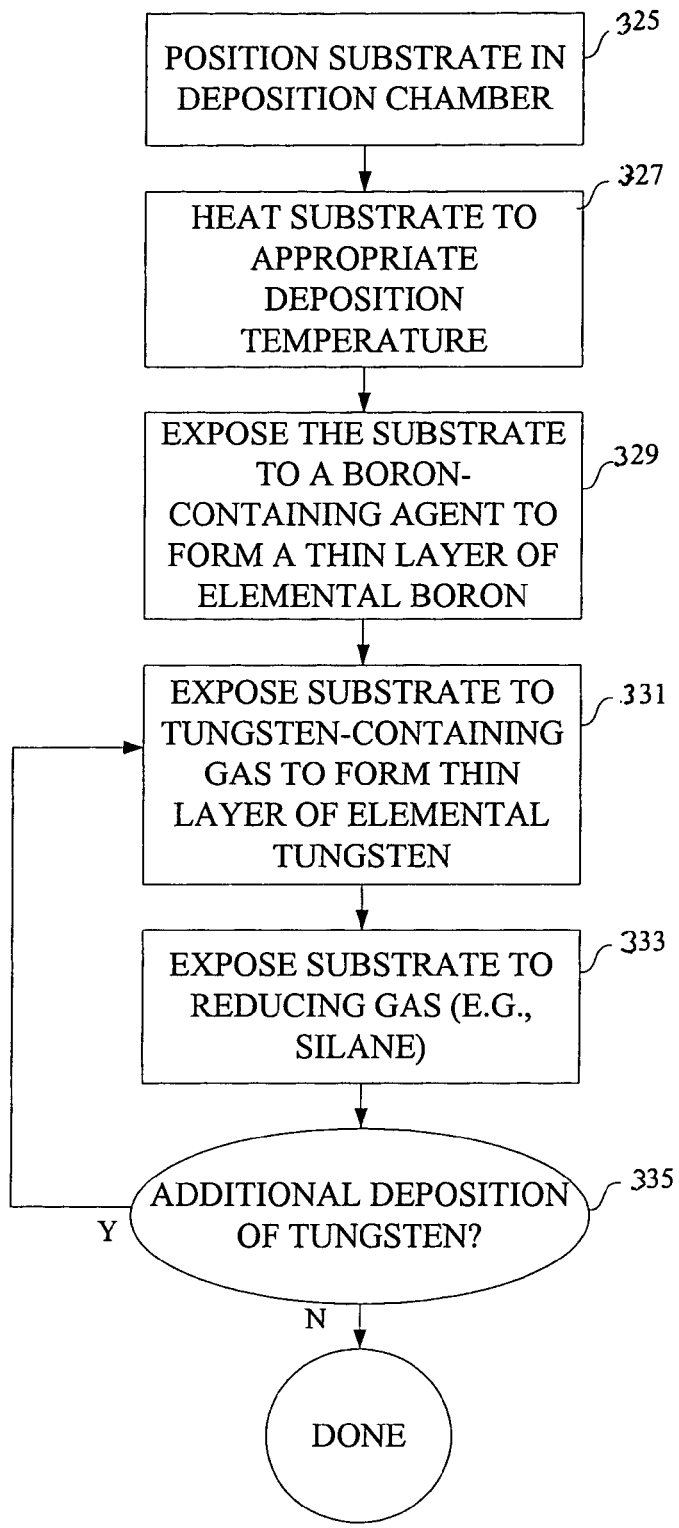

FIG. 3A depicts a process flow that employs nitrogen gas during formation of a tungsten film in accordance with an embodiment of this invention. The process begins at 301 where the semiconductor substrate is positioned in the deposition chamber. As indicated various deposition chambers are suitable for use with this invention. Some examples are described elsewhere herein. Generally, chamber should allow control of process gas flow rates, chamber pressure, and substrate temperature. At an operation 303, the process heats the substrate to a temperature desired for the tungsten nucleation layer formation. As indicated above, this is preferably in the range of about 200 to 475 C.

After the substrate is properly position and heated, the process forms a thin tungsten nucleation layer on it. See block 305 of FIG. 3A. This process takes place while the substrate is exposed to nitrogen. The nucleation layer may be generated by a PNL process so long as nitrogen is used. Generally, PNL "nucleation layers" employed in this invention are 25–100 Angstroms thick, provide at least about 90% step coverage in 10:1 aspect ratio contacts, and have roughness of <10% of the nucleation layer thickness. This applies regardless of what technique (CVD or PNL) is employed to form the nucleation layers. For CVD nucleation the film must be at least 250–450 A thick. Step coverage of nucleation is about 40–80% with CVD.

As indicated, the nitrogen may be introduced before, at the same time, or after the reaction gases enter the reaction chamber. As explained, when a process introduces nitrogen before nucleation layer deposition starts, the initial nucleation may be delayed. So it will sometimes be preferred to introduce nitrogen only after the deposition process begins. It has been found that this results in short nucleation delays with excellent film thickness uniformity. Typically this means that nitrogen is not introduced until after the reducing agent and $WF_6$ doses have been completed. Some situations may even require waiting until multiple $WF_6$ and $SiH_4$ cycles (e.g., 4 to 6) have been completed such that nucleation has been completed and W growth has started on the wafer surface. It has been discovered that in some cases, the delay between the start of nucleation deposition (when tungsten actually begins to deposit) and the start of nitrogen flow is preferably in the range of about 0.25–1.00 second. Preferably, nitrogen flow rates during nucleation layer phase are in the range of about 1–20% by volume of total gas flow per deposition station, and more preferably in the range of about 1–10% by volume. As indicated, it can be important to cut off nitrogen flow prior to the end of deposition at one station so that nucleation can be unhindered at a next station.

Another approach involves turning nitrogen on and off such that it is only flowing when a tungsten precursor is flowing and is off during purge and reducing agent dose times. In this implementation, nitrogen starts flowing shortly after the start of each tungsten precursor dose and stops just before the end of each tungsten precursor dose.

After the nucleation layer has been formed as indicated at block 305, the next process operation forms a bulk tungsten layer on the nucleation layer. See block 307. As an example, the bulk tungsten layer may be generated using a CVD process and one or more of the following process gas combinations: $WF_6$—$H_2$ or $WF_6$—$B_2H_6$ or $W(CO)_6$. As with nucleation layer deposition, the nitrogen may be introduced before, at the same time, or after the process gas(es) enter the reaction chamber; preferably only after the deposition process begins. This is for the same reason as with the nucleation layer: reduced nucleation delays with excellent film thickness uniformity. Also, the delay between the start of bulk layer deposition and the start of nitrogen flow is preferably in the range of about 0.25–1 second, for example. And as with the nucleation layer deposition, the nitrogen flow rates during the bulk layer phase are in the range of about 1–20% by volume of total gas flow per deposition station, and more preferably in the range of about 1–10% by volume.

Note that while the method presented in FIG. 3A requires nitrogen in both nucleation layer deposition and bulk layer deposition, the nitrogen aspect of the invention is not limited in this way. It will be sufficient to apply nitrogen to one or the other of the nucleation layer and bulk layer deposition operations.

Multi-layer PNL for Step Coverage and Roughness Reduction

As mentioned, PNL offers lower film roughness and greater step coverage than can be achieved with CVD as deposited from $WF_6$—$H_2$, for example. The tungsten deposition rate by PNL, however, is significantly lower than by CVD at typical deposition conditions in semiconductor processing equipment (about 300–500 C., about 10–300 Torr total pressure). In accordance with this embodiment of the invention, the two films can be combined advantageously to produce a tungsten film with growth rates comparable to CVD and roughness and step coverage comparable to PNL by depositing alternating layers of PNL-W and CVD-W. The reduced roughness of the PNL-W film serves as a template to encourage reduced roughness for CVD-W deposited on PNL-W. This benefit begins to wear off after several hundred angstroms of CVD-W deposition, but alternating layers of PNL-W and CVD-W can renew it.

One example process flow for this multi-layer deposition is depicted in FIG. 3B. As shown there, the process begins with positioning the semiconductor substrate in the deposition chamber as described above. See process block 309. Next, the substrate is heated to a desired temperature, again as described above. See block 311.

Next, a tungsten nucleation layer is formed by CVD or PNL, with or without exposing the substrate to nitrogen as described above. See block 313. Thereafter, a bulk tungsten layer is formed on the nucleation layer. See block 315. The bulk layer may be formed using any suitable CVD process (e.g., $WF_6$—$H_2$ or $WF_6$—$B_2H_6$ or $W(CO)_6$), with or without exposing the substrate to nitrogen.

As indicated, the bulk layer will have reduced roughness because it is formed on the "smooth" nucleation layer. But after some amount of deposition, the bulk layer grains will grow relatively large and increase the roughness of the tungsten film. To prevent this, the bulk layer growth may be terminated after the tungsten deposited by this process grows to a certain thickness (e.g., 500 angstroms). Thereafter, a tungsten "cap layer" is formed on the tungsten bulk layer. See process block 317. This reduces the overall roughness of the tungsten film and improves its step coverage.

One example of a PNL process for forming the tungsten cap layer proceeds as follows. Initially, the process system flows a reducing gas into the deposition chamber whereby about one or more monolayers of reducing gas are adsorbed or otherwise deposited onto the surface of the substrate. Next, the system purges the reducing gas from the chamber. Then, it flows a tungsten-containing gas into the chamber to react with the adsorbed reducing agent and create a thin tungsten film. Next, it purges the tungsten-containing gas from the chamber. These operations are repeated until the desired thickness of tungsten is obtained (e.g., 100 angstroms). Note that the cap layer may be deposited with or without the nitrogen. Note that chamber purge is accomplished by shutting off reagent gas (WF6, SiH4, B2H6, N2) while continuing carrier gas flows (Ar, H2). The carrier gasses flow for a few seconds to sweep residual reagent gas from the process chamber. During the chamber purge one can maintain the chamber at a constant pressure or cycle the chamber pressure from the deposition pressure (typically 40 Torr) to a lower pressure (1–10 Torr) and then back to process pressure (40 Torr). This pressure cycling provides pump-purge. It is more effective than constant pressure purging for removing residual reagent gas from the chamber, but it also takes several seconds to cycle the pressure, which may hurt throughput.

After the cap layer has been deposited to the desired thickness, the process may be complete. Alternatively, an additional CVD bulk layer may be deposited on the cap layer to accelerate the overall deposition rate. Such bulk layer is the second tungsten bulk layer in the film and may be the last layer in the film. Alternatively, another PNL cap layer can be deposited on the second bulk layer. So it is possible, to continue with one or more additional cycles of bulk layer and cap layer deposition after the first cap layer is deposited. This serves to further optimize the overall roughness and step coverage of the resulting film stack.

Decision operation 319 in FIG. 3B illustrates that additional bulk-cap layer deposition cycles may be performed as necessary to achieve a desired overall thickness of the tungsten film. In a typical situation, the process will have a predefined number of alternating bulk layer depositions and PNL cap layer depositions. Each such deposition will be of a predefined thickness. In one embodiment, the initial tungsten nucleation layer is deposited to a thickness of between about 10–100 Å using a PNL process. Each tungsten bulk layer is deposited to a thickness of between about 100–1000 Å using CVD. And each tungsten cap layer is deposited to a thickness of between about 50–200 Å using a PNL process. In general, the thickness of PNL-W and CVD-W layers may be constant or variable for each tungsten layer in the film stack. In an alternative approach, the number of individual layers to be deposited is determined during the process by using one or more feedback or monitoring techniques that indicate whether the overall tungsten film has reached a desired thickness, step coverage, roughness, etc.

FIG. 3B shows that a tungsten cap layer terminates tungsten film stack. But in general, either a CVD tungsten bulk layer or a PNL tungsten cap layer may terminate the stack. In a specific embodiment, the PNL tungsten at the bottom and the top of the film stack is employed.

Figure 4A:
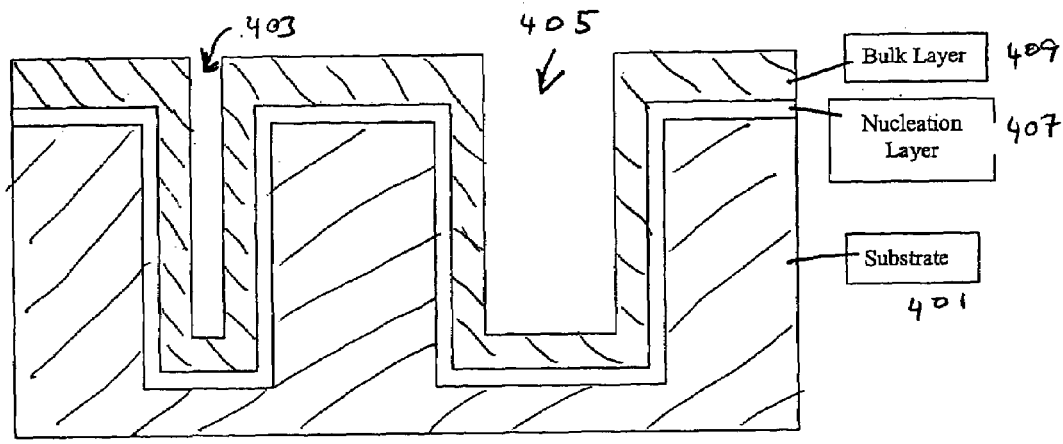
FIGS. 4A–4C show a growing tungsten film stack in which alternating layers of CVD bulk layer and PNL cap layer are deposited.
Figure 4B:
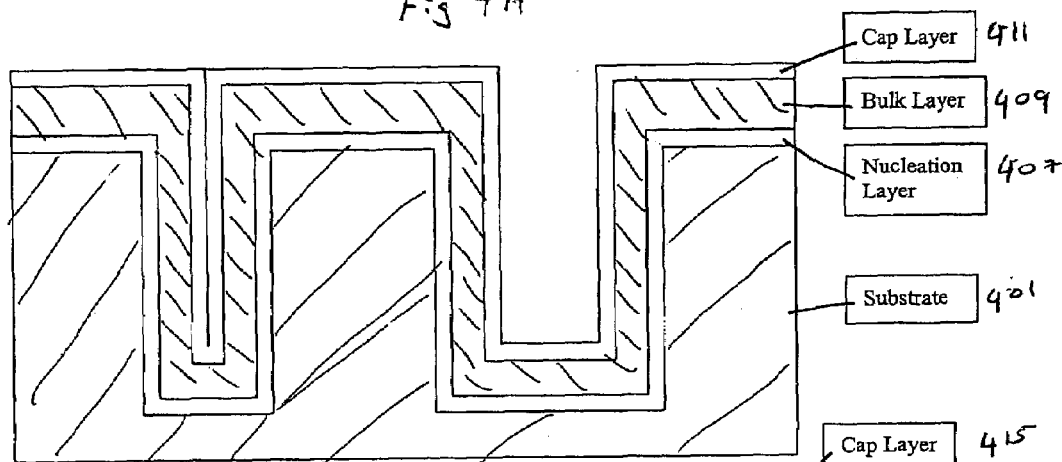
Figure 4C:
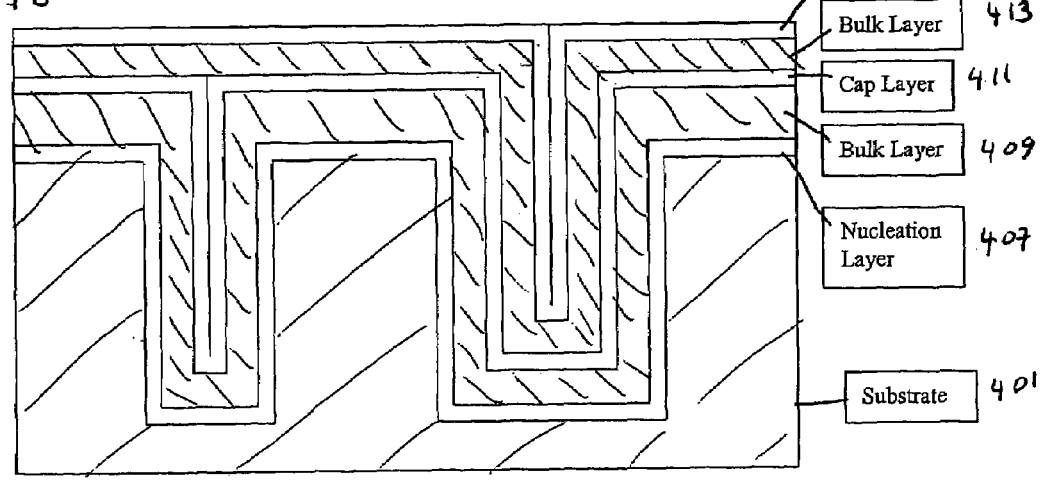

FIGS. 4A–4C show a growing tungsten film stack in which alternating layers of CVD bulk layer and PNL cap layer are deposited. In FIG. 4A, a semiconductor substrate 401 is provided with recesses 403 and 405, which may be vias, contact holes, trench lines, etc. A tungsten nucleation layer 407 forms the first tungsten layer on substrate 401. A first bulk tungsten layer 409 resides on top of nucleation layer 407. FIG. 4B shows the structure of FIG. 4A, but with a first tungsten cap layer 411 formed on top of first bulk layer 409. So the tungsten film stack now has the form: nucleation layer—bulk layer 1—cap layer 1. FIG. 4C shows the structure of 4B but with an additional bulk layer 413 and cap layer 415 formed after another cycle of CVD bulk layer deposition and PNL cap layer deposition. The tungsten film stack existing in FIG. 4C is as follows: nucleation layer—bulk layer 1—cap layer 1—bulk layer 2—cap layer 2. As can be seen, in this example, the second cap layer (415) completes the fill of recesses 403 and 405. So the tungsten deposition process may be terminated at this point.

PNL Nucleation with Initial Pulse of Diborane (B2H6) Reducing Agent

PNL tungsten film properties can be substantially altered by the choice and introduction sequence of process gasses. In particular, it is advantageous to begin PNL tungsten deposition with a single dose of a boron-containing reducing agent (e.g., $B_2H_6$) prior to the first dose of tungsten-containing gas (e.g., $WF_6$). After the initial doses of $B_2H_6$—$WF_6$, the remaining cycles of PNL tungsten deposition can proceed as described above (e.g., alternating $SiH_4$ and $WF_6$ pulses).

In this approach, the diborane (or other boron-containing precursor) reacts on a substrate surface to form a "sacrificial layer" of elemental boron. This sacrificial layer subsequently reacts with a tungsten precursor to form elemental tungsten. The boron deposition process is not a conventional self-limiting ALD type deposition process (contrast silane-based reactions for example). Rather, the diborane (or other suitable boron-containing material) decomposes thermally to produce a boron film under typical PNL or CVD operating conditions (e.g., 200–400 C., 1–300 Torr) on the dielectric surface. The reaction can proceed so long as the substrate is exposed to boron reducing agent. However, to ensure that a limited amount of tungsten is actually formed in the subsequent step, the diborane deposition is preferably limited to a thickness of between about 3 and 10 angstroms. This may correspond to about one to three monolayers of diborane. In the second operation of the process, the elemental boron layer is exposed to a tungsten precursor, which is reduced by the boron to elemental tungsten.

Preferably, the boron operation is performed at a moderate temperature (e.g., 300 degrees centigrade) in order to ensure that a sufficient quantity of boron is formed on the surface in a reasonable amount of time. Regarding other parameters, generally the process steps are performed at a pressure of between about 0.1 and 300 torr and the doses are defined by the flow rates and contact time. Generally, the boron-containing reducing agent can be any process-compatible boron compound capable of effectively reducing a tungsten precursor to produce a layer of metallic tungsten. Examples of suitable boron-containing reducing agents include boranes such as Hexaborane ($B_6H_{10}$), triborane, diborane ($B_2H_6$), etc.

Measurements indicate first order boron growth kinetics from $B_2H_6$ with an activation energy of roughly 200 kJ/gmol. Thus a very thin boron film can be deposited as a sacrificial layer prior to the first $WF_6$ or other W containing reagent pulse. The amount of B on the surface is tailored to provide adequate nucleation sites for $WF_6$ to begin nucleation and tungsten growth on all surfaces of the wafer. This dramatically reduces the sensitivity of the PNL process to variations in the incoming semiconductor wafers substrate. In particular, with a properly optimized B layer from the first $B_2H_6$ pulse, one can even nucleate tungsten on wafer surfaces with discontinuous Ti—TiN line-barrier films. In extremely high aspect ratio semiconductor contact structures for logic and DRAM devices this is very important, because poor step coverage from PVD or CVD Ti and TiN barriers often creates discontinuous films near the bottom of contacts when the aspect ratios of the contacts exceed 10:1 (depth/diameter).

$B_2H_6$ is not without faults as a reducing agent for PNL tungsten. Because $B_2H_6$ deposits by a thermal CVD process and is not self-limiting, it is possible to have step coverage problems with boron deposition from $B_2H_6$. This is typically not seen for features with aspect ratios less than 20:1, but may be an issue for aggressive (DRAM) structures with aspect ratios of 60:1 or more. $SiH_4$ is self-limiting and can fully saturate any topography given sufficient dose times. Therefore a preferred implementation for PNL tungsten growth is to begin with an initial pulse of $B_2H_6$ and follow that with alternating doses of $WF_6$ and $SiH_4$. $B_2H_6$ dose time is optimized to provide adequate nucleation sites for subsequent tungsten growth. The boron also serves as a getter to consume excess fluorine generated by the decomposition of $WF_6$. Subsequent doses of $WF_6$ and $SiH_4$ are self-limiting and result in uniform and totally conformal tungsten film growth.

It has been observed that the choice of carrier gas for $B_2H_6$, $WF_6$, and $SiH_4$ can be important. In some cases, $B_2H_6$ in an $N_2$ carrier produces measurable improvements in PNL-W step coverage compared to $B_2H_6$ in argon carrier gas. It is clear that $N_2$ can suppress tungsten growth from $WF_6$—$H_2$ CVD by suppressing nucleation of new tungsten grains. In the case of $B_2H_6$—$N_2$ as an initial reducing agent pulse for tungsten PNL, the $N_2$ may promote tungsten nucleation on accessible boron on the wafer surface before tungsten starts to grow on existing tungsten nuclei.

The boron process is exemplified in FIG. 3C. In process operations 325 and 327, a semiconductor substrate is positioned in the deposition chamber and heated to a desired temperature as with the processes of FIGS. 3A and 3B. Thereafter, at an operation 329, the substrate is exposed to an initial pulse of a boron-containing agent (e.g., $B_2H_6$). In one implementation, the boron agent is provided at moderate concentration in a carrier gas (e.g., 5% by volume $B_2H_6$ in a $N_2$ carrier gas). After the boron-containing compound is flowed to the reactor for a period of time (e.g., between about 0.1 and 10 seconds), the deposition station (or chamber in the cases of a single wafer reactor) is purged with a suitable purge gas such as hydrogen, nitrogen, or argon.

After operation 329 is complete, the substrate will be covered with a thin layer of elemental boron. At this point, the substrate is exposed to a pulse of tungsten-containing gas (e.g., $WF_6$). See operation 331. The elemental boron reduces the gas to elemental tungsten to form a thin layer of tungsten on the substrate surface. The thickness of that layer is determined by the thickness of the boron on the surface. In one embodiment, the substrate is exposed to the tungsten-containing gas for a period of between about 0.1 and 10 seconds. Thereafter the tungsten-containing gas is purged from the chamber using a suitable purge gas (e.g., argon, nitrogen, and/or hydrogen).

In the embodiment depicted in FIG. 3C, the substrate is next exposed to a reducing gas, preferably a silane (e.g., $SiH_4$). See block 333. This begins a more "conventional" phase of the PNL process. Preferably, the reducing gas contacts the substrate for a period of between about 0.1 and 10 seconds and is then purged from the system using argon, nitrogen, hydrogen, etc.

Operations 331 and 333 may be repeated until the desired tungsten PNL film thickness has been achieved. As indicated, these serve as a conventional PNL cycle. In many cases, both operations are self-limiting. Only as much silane reducing agent deposits as can be adsorbed on the substrate surface, and only as much tungsten-containing gas reacts as can be consumed by the adsorbed silane. Decision operation 335 in FIG. 3C allows for multiple PNL cycles (post-boron deposition) in the process flow. As in the case of FIG. 3B, the process may continue until a predefined quantity of tungsten has been deposited or it is determined that a termination criterion has been met (e.g., thickness, roughness, etc.). Each cycle may use the same tungsten-containing gas or some cycles may use different tungsten-containing gases. In one example, each cycle employs $WF_6$. Further, each cycle may use the same reducing agent or some cycles may use a different reducing agent.

As a variant on this implementation, it may be desirable to expose the wafer to a brief $WF_6$ pulse prior to either $B_2H_6$ or $SiH_4$ reducing agent dosing. $WF_6$ will react strongly with metals or silicon and can promote nucleation on partially oxidized metal or silicon surfaces. However, the intensity and duration of the initial $WF_6$ dose should be well controlled to prevent fluorine attack of silicon, metal, or other vulnerable materials.

As a further variant of the implementation, the process may repeat operations 329, 331, and 333 may be repeated as required to build up the desired thickness of PNL tungsten. In other words, the boron-containing gas is used in more than merely the initial operation. It may be used in place of silane or in conjunction with silane (or other reducing agent) in subsequent cycles. Preferably, the exposure time of the substrate to each reactant is optimized for the beginning, middle, and end of the deposition process. One variant includes a long boron-containing gas dose during the initial cycles, a short tungsten-containing gas dose during the initial cycles, and a long silane dose during the initial cycles. These changes promote reduced nucleation delay and enhanced device protection from fluorine attack. The timing variations can be implemented by carefully controlling the divert, line-charge, dose, and purge times using an apparatus such as that depicted in FIG. 5, described below.

Deposition Chamber and Associated Apparatus

The methods of the invention may be carried out in a Novellus Concept-1 Altus, a Concept 2 Altus, a Concept-2 ALTUS-S, a Concept 3 Altus deposition system, or any of a variety of other commercially available CVD tools. More specifically, the process can be performed on multiple deposition stations sequentially. See, e.g., U.S. Pat. No. 6,143,082, which is incorporated herein by reference for all purposes. In some embodiments of the present invention, the pulsed nucleation process is performed at a first station that is one of two, five or even more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface. Of course, nitrogen gas may also be introduced, as appropriate, at any time during the process.

In one example, after nucleation of the tungsten film is complete, the gases are turned off. The semiconductor substrate, having a first thickness of tungsten deposited at a first rate, is then moved to a second deposition station and a new wafer is moved into place on the first station. The wafers may be indexed from one deposition station to the next to enable parallel wafer processing after one or more repetitions of the cycle. The full thickness of the tungsten film is achieved by additional cycles with alternating reducing gases and tungsten-containing gases at one or more of the other deposition stations. This is repeated until all substrates are coated to the desired thickness. It is the sum of these individual depositions that forms the total amount of tungsten nucleation layer deposited. Any number of deposition stations, each capable of having a localized atmosphere isolated from adjacent stations, is possible within the single chamber.

The invention also provides for a deposition chamber in which alternating deposition stations are dedicated to deliver either tungsten-containing gases or reducing gases. More specifically, the deposition stations in the chamber are separated into two groups with the first group dedicated to delivery of the reducing gases and the second group for introducing tungsten-containing gas. These stations also can provide for the simultaneous delivery of inert gases and/or nitrogen with the dedicated gases. Thus, tungsten is deposited by moving wafers from station to station such that the wafer is sequentially exposed to the reducing gases and then the tungsten-containing gases until the desired thickness of tungsten is obtained.

Another aspect of the invention provides a module containing one or more of the following design elements for alternating deposition of tungsten:

a plurality of deposition stations comprising a showerhead or dispersion plate for uniform gas introduction paired with a heated pedestal that holds a wafer underneath the showerhead;

a plurality of deposition stations with showerheads flush-mounted with the top of the module vacuum chamber to minimize gas re-circulation in the module and promote efficient purging between alternating deposition steps;

a fully purged top plate of the module vacuum chamber consisting of a purge gas plenum covering the top plate area not occupied by deposition showerheads wherein improved station-to-station isolation and reduced purge times between deposition cycles are obtained; or a vacuum chamber in which the heated pedestals from each deposition station are completely or partially isolated from each other by an annular pumping ring connected to the chamber exhaust. This feature further enhances station-to-station isolation and enables different processes to be run simultaneously on alternate stations in the same module.

The module may further comprise means, provided to each showerhead, for creating a RF plasma in between the showerheads and the substrate platens. Preferably, such means comprise an RF energy source, a match network, and the necessary electrical connections. In another embodiment, the module may further comprise means for creating a microwave plasma in the chamber. Some modules may provide a divert line connected directly to the process vacuum exhaust (pump or vacuum foreline) such that process gasses can bypass the deposition chamber during the time immediately after their respective mass flow controllers (MFCs) are turned on. In addition, the gas delivery system may be provided with a mechanism for controlling the line charge volume. This can be important in precisely timing delivery of nitrogen, tungsten precursor (e.g., $WF_6$), and/or reducing agent (e.g., $SiH_4$ and $B_2H_6$). With such hardware features, all gasses that pulse on and off during PNL can be delivered with a divert and line charge process sequence.

Figure 6:
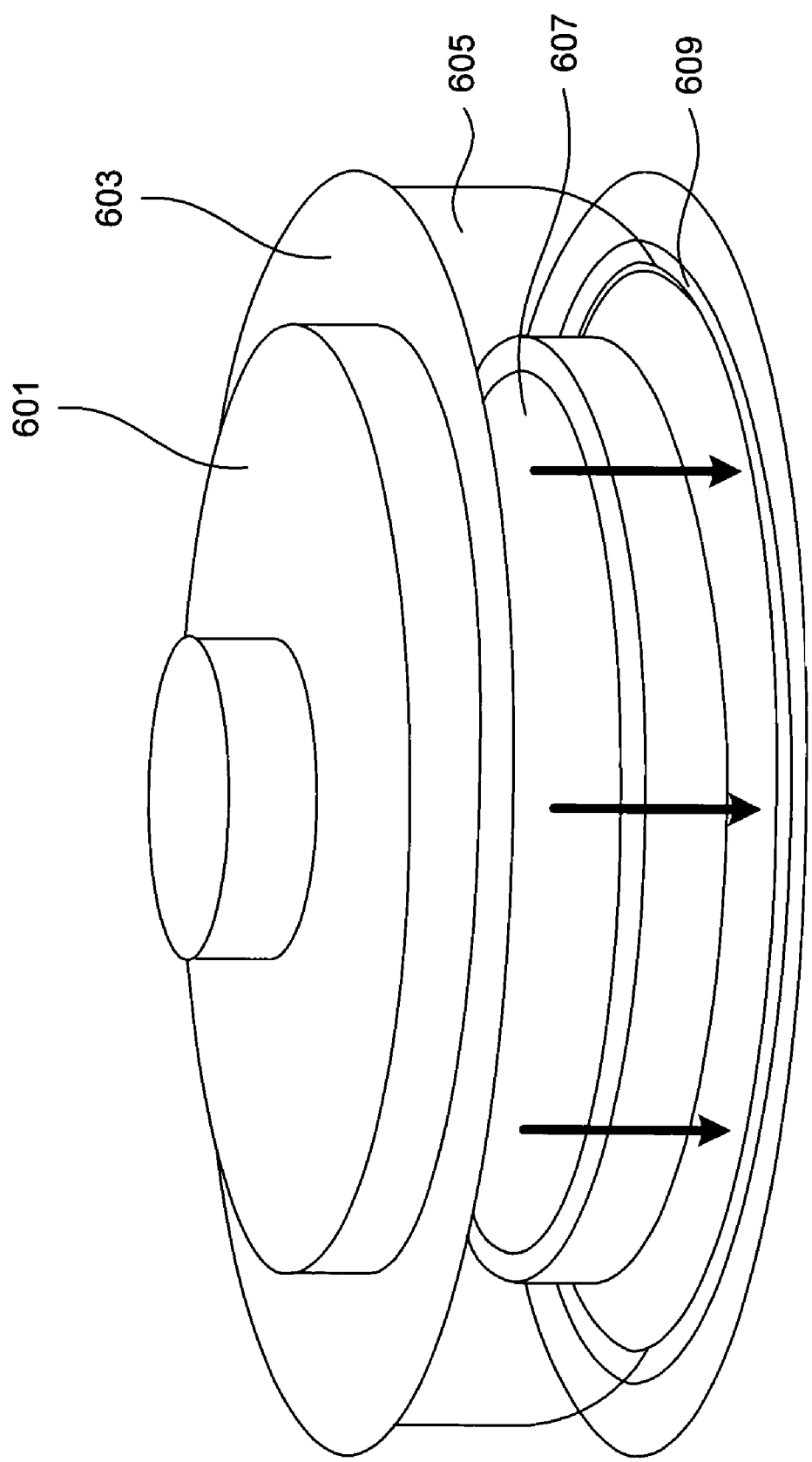
FIG. 6 shows a schematic representation of a deposition station module having a flush-mounted showerhead 601, a fully purged top plate 603, and an annular pumping port 609. Wafer 607 is surrounded by an inert gas curtain 605.

A representative example of such a module having a flush-mounted showerhead, a fully purged top plate, and an annular pumping port is shown in FIG. 6.

As will be appreciated in the art, each such deposition station will typically have a heated substrate platen for holding and heating a substrate to a predetermined temperature. In addition, each typically will have a backside gas distribution system to prevent deposition of the tungsten film on the backside of the substrate, and a vacuum clamping manifold for clamping the substrate to the platen. Finally, the deposition chamber can be equipped with a transport system for transporting wafers or substrates into and out of the chamber as well as between deposition stations.

Figure 5:
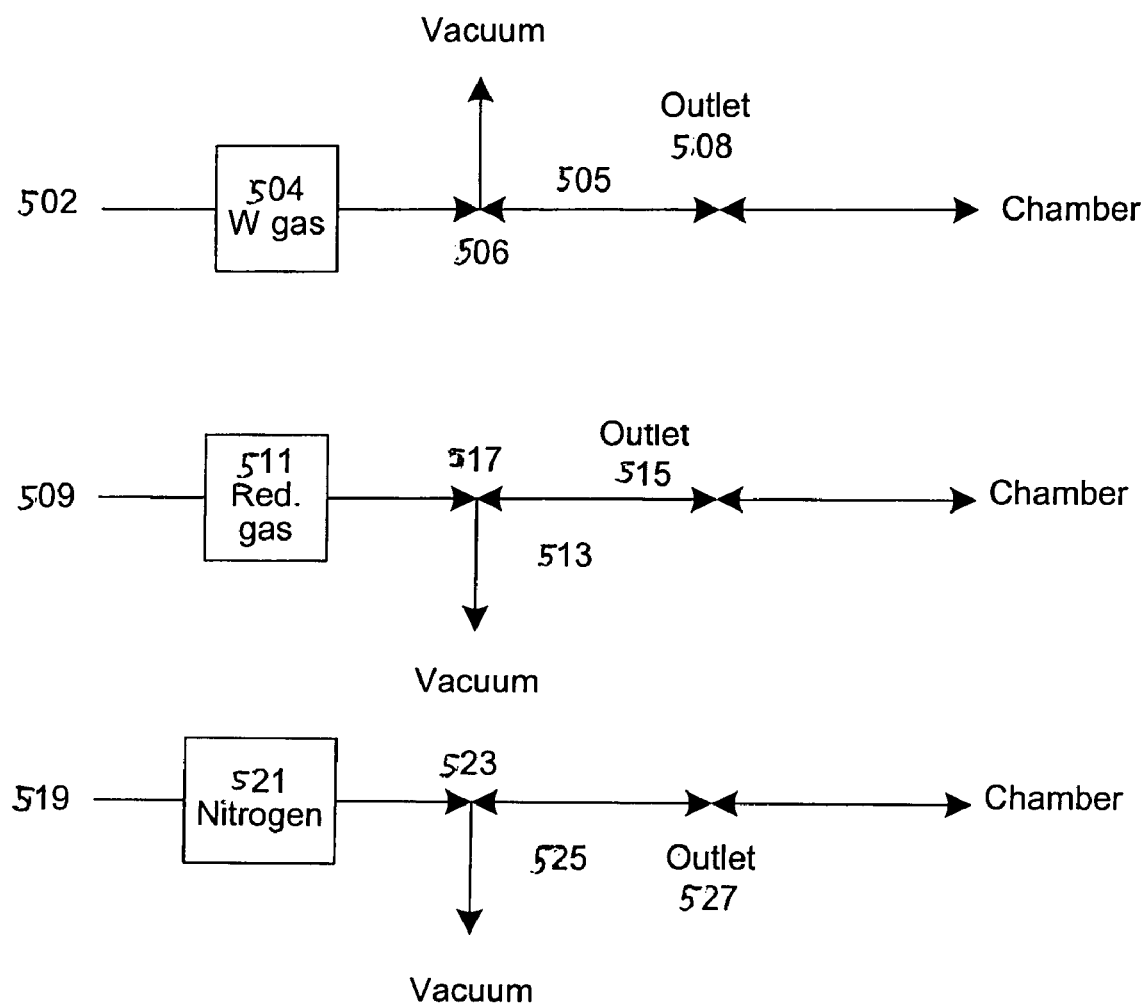
FIG. 5 shows a schematic representation of an embodiment of the dual divert gas box.

The invention may be implemented using a gas manifold system, which provides line charges to the various gas distribution lines as shown schematically in FIG. 5. Manifold 504 has an input 502 from a source of the tungsten-containing precursor gas (not shown), manifold 511 has an input 509 from a source of the reducing gas (not shown) and manifold 519 has an input 521 from a source of nitrogen gas (not shown). The manifolds, 504, 511 and 521 provide the tungsten-containing precursor gas, reducing gas and nitrogen to the deposition chamber through valved distribution lines, 505, 513 and 525 respectively. The various valves are opened or closed to provide a line charge, i.e., to pressurize the distribution lines. For example, to pressurize distribution line 505, valve 506 is closed to vacuum and valve 508 is closed. After a suitable increment of time, valve 508 is opened (valve 515 is closed) and the tungsten-containing precursor gas is delivered to the chamber. As explained above, the precursor gas can be supplied with nitrogen in some embodiments. After a suitable time for delivery of the gas, valve 508 is closed. The chamber can then be purged to a vacuum by opening of valve 506 to vacuum.

Similar processes are used to deliver the reducing gas and the nitrogen. To introduce the reducing gas, for example, distribution line 513 is charged by closing valve 515 and closing valve 517 to vacuum. Opening of valve 515 allows for delivery of the reducing gas to the chamber. Similarly, to introduce the nitrogen, distribution line 525 is charged by closing valve 527 and closing valve 523 to vacuum. Opening of valve 527 allows for delivery of the nitrogen to the chamber. It has been found that the amount of time allowed for line charges changes the amount and timing of the initial delivery of the gas. Some examples of suitable line charge times are presented below.

FIG. 5 also shows vacuum pumps in which valves 506, 517 and 523, respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

As indicated, it may be necessary to employ both a boron-containing reducing agent and a silane reducing agent for the same process. In such cases, there may be two subsystems for the reducing agent: one for the boron-containing reducing agent and another for the silane.

Note that the PNL processes described above may require precise timing of valves and mass flow controllers (MFCs) supplying pulses of reagent to the semiconductor substrate during PNL-W deposition. In one way to make this possible, valve and MFC commands are delivered to embedded digital input-output controllers (IOC) in discrete packets of information containing instructions for all time-critical commands for all or a part of a PNL deposition sequence. The C2 and C3 ALTUS systems of Novellus provide at least one IOC sequence. The IOCs can be physically located at various points in the apparatus; e.g., within the process module or on a stand-alone power rack standing some distance away from the process module. There are typically multiple IOCs in each module (e.g., 3 per module). With respect to the actual instructions included in a sequence, all commands for controlling valves and setting flow for MFCs (for all carrier and reactant gases) may be included in a single IOC sequence. This assures that the timing of all the devices is tightly controlled from an absolute standpoint and also relative to each other. There are typically multiple IOC sequences running at any given time. This allows for, say, PNL to run at stations 1–2 with all timing controlled for all the hardware components needed to deposit PNL-W at those stations. A second sequence might be running concurrently to deposit CVD-W at stations 3–4–5. The relative timing of the devices controlling the delivery of reagents to stations 3–5 is important within that group of devices, but the relative timing of the PNL process at stations 1–2 can be offset from the relative timing of CVD at stations 3–5. An IOC translates the information in a packetized sequence and delivers digital or analog command signals directly to MFC or pneumatic solenoid banks controlling the valves. This implementation reduces delays in command execution at the valve or MFC to as little as 5 ms. Typical control systems in which commands are issued one by one to the IOC are subject to communication delays between the computer controlling module operation and the IOC. Delays in the single-command implementation can exceed 250 ms. In one example, to achieve good response and repeatability, the nitrogen flow may be introduced by first enabling nitrogen flow through a nitrogen Mass Flow Controller (MFC) and diverting the flow to a process vacuum pump to stabilize flow before introducing the nitrogen into the deposition chamber. To stabilize the nitrogen flow, the nitrogen outlet valve 527 is closed while nitrogen divert valve 523 is open. The manifold system then pressurizes nitrogen delivery line 525 to assure a controlled initial burst of nitrogen gas by closing the nitrogen divert valve 523 with the nitrogen process outlet valve 527 closed for between about 0.10 and 3.00 seconds. Next, the system opens the nitrogen outlet valve 527 to the deposition chamber with the divert valve closed to deliver nitrogen to the process chamber during deposition. Preferably, all valve timing is controlled using an embedded input-output controller command sequence as described above. The above process may be applied to deposition of tungsten nucleation layers, bulk layers, and/or cap layers, using PNL or CVD.

One manifold system sequence for delivering a boron-containing gas (e.g., diborane) to the chamber involves the following operations. First, the system divert a diborane-carrier gas mixture to a vacuum pump for a period of time while the MFC or other flow controlling device stabilizes. Preferably, this is done for between about 0.5 and 5 seconds using a mixture of 5% by volume diborane in a nitrogen carrier gas. Next the system pressurizes the diborane delivery manifold by closing both the divert valve and the outlet to the deposition chamber. In one implementation, this is done for a period of time between about 0.1 to 5 seconds. This creates an initial burst of reagent when the outlet to the deposition chamber is opened. In one implementation, the outlet valve is opened for a period of between about 0.1 to 10 seconds. This is then followed by purging diborane from the chamber using a suitable carrier gas.

A pulse of tungsten-containing gas may be generated as follows. Initially, the system diverts $WF_6$ (an example of the gas) to a vacuum pump for a period of time while the MFC or other flow-controlling device stabilizes. This may be done for a period of between about 0.5 to 5 seconds in one example. Next, the system pressurizes the tungsten gas delivery manifold by closing both the divert outlet 506 and the outlet 508 to the deposition chamber. This may be done for a period of between about 0.1 and 5 seconds, for example, to create an initial burst of reagent when the outlet to the deposition chamber is opened. This is accomplished by opening outlet valve 508 for between about 0.1 and 10 seconds in one example. Thereafter, the tungsten-containing gas is purged from the deposition chamber using a suitable purge gas.

The pulsed flow of silane or other reducing gas may be implemented in a similar manner by controlling divert valve 517 and outlet valve 515. The divert, line pressurization, and flow steps may be timed as presented above for the tungsten-containing gas example. After pulsing with reducing gas for a period of between about 0.1 and 10 seconds, outlet valve 515 is closed and a purge gas is flowed through the chamber.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference in their entirety.

What is claimed is:

1. A method of forming a tungsten film on a semiconductor substrate, the method comprising:
   (a) depositing a tungsten nucleation layer on the semiconductor substrate;
   (b) depositing a tungsten bulk layer on the nucleation layer using a chemical vapor deposition (CVD) process; and
   (c) depositing a tungsten cap layer having a thickness between about 50 and 200 angstroms on the tungsten bulk layer using a pulsed nucleation layer (PNL) deposition technique; wherein the tungsten film stack is terminated by a tungsten cap layer and said cap layer reduces the roughness of the tungsten film stack.

2. The method of claim 1, further comprising repeating (b) and (c).

3. The method of claim 1, further comprising repeating (b) and (c) multiple times.

4. The method of claim 1, wherein (a) comprises:
   positioning the semiconductor substrate in a reaction chamber;
   heating the semiconductor substrate; and
   performing PNL on the semiconductor substrate using a tungsten-containing gas and a reducing gas.

5. The method of claim 4, wherein the reducing agent is a silane.

6. The method of claim 1, wherein (b) comprises exposing the semiconductor substrate to a process gas comprising one or more of the following:
   $WF_6$—H2, $WF_6$—$B_2H_6$, and $W(CO)_6$.

7. The method of claim 1, wherein (c) comprises:
   (i) flowing a reducing gas into a deposition chamber holding the semiconductor substrate, whereby the reducing gas is adsorbed onto said semiconductor substrate;
   (ii) purging the reducing gas from the deposition chamber;
   (iii) flowing a tungsten-containing gas into said deposition chamber, whereby said deposited reducing gas is substantially reduced to a tungsten film;
   (iv) purging the tungsten-containing gas from the deposition chamber; and
   (v) repeating (i) through (iv) for one or more additional cycles.

8. The method of claim 7, wherein the reducing gas is a silane.

9. A method of forming a tungsten film on a semiconductor substrate, the method comprising:
   (a) depositing a tungsten nucleation layer on the semiconductor substrate by contacting the semiconductor substrate with multiple cycles of alternating pulses of a tungsten-containing gas and a reducing agent; and
   (b) depositing a tungsten bulk layer on the tungsten nucleation layer by a CVD process in which the semiconductor substrate is exposed to nitrogen;
   wherein depositing the tungsten nucleation layer comprises performing at least one pulsed cycle prior to flowing nitrogen, performing one or more pulsed cycles in the presence of nitrogen, and shutting off the nitrogen flow prior to the final pulsed cycle.

10. The method of claim 9, wherein (a) comprises performing PNL by alternating exposure of the semiconductor substrate to the tungsten-containing gas and the reducing agent.

11. The method of claim 9, wherein the nitrogen employed in (a) comprises between about 1 and 20% by volume of the total gas flow to the semiconductor substrate.

12. The method of claim 9, wherein the nitrogen employed in (b) comprises between about 1 and 20% by volume of the total gas flow to the semiconductor substrate.

13. The method of claim 9, wherein (b) comprises exposing the semiconductor substrate to a tungsten-containing gas selected from the group consisting of $WF_6$ and $W(CO)_6$ and combinations thereof.

14. The method of claim 9, wherein the delay between the start of the tungsten nucleation layer deposition and exposure to nitrogen is between about 0.25 and 1 second.

15. The method of claim 9, wherein (b) comprises delaying exposure of the semiconductor substrate to nitrogen until after deposition of the tungsten bulk layer has begun.

16. The method of claim 15, wherein the delay between the beginning of tungsten bulk layer deposition and exposure to nitrogen is between about 0.25 and 1 second.

17. The method of claim 9, wherein (a) comprises stopping exposure of the semiconductor substrate to nitrogen prior to completion of the deposition of the tungsten nucleation layer.

18. A method of forming a tungsten film on a semiconductor substrate in a reaction chamber, the method comprising:
   (a) forming an initial boron layer on the semiconductor substrate;
   (b) contacting the substrate with a tungsten-containing precursor that is reduced to form a tungsten layer on the semiconductor substrate;
   (c) contacting the semiconductor substrate with a silane to form a layer of silane; and
   (d) contacting the layer of silane with the tungsten-containing gas to thereby reduce the tungsten-containing gas to another tungsten layer on the semiconductor substrate.

19. The method of claim 18, wherein (a) comprises decomposing a borane compound on the semiconductor substrate.

20. The method of claim 19, wherein the borane compound is diborane.

21. The method of claim 19, further comprising heating the semiconductor substrate to a temperature of between about 200 and 400C. and contacting the semiconductor substrate with the borane compound in the vapor phase.

22. The method of claim 21, wherein the vapor phase comprises a nitrogen carrier gas in addition to the borane compound.

23. The method of claim 21, further comprising purging the reaction chamber of the borane compound after contacting the semiconductor substrate with the borane compound in the vapor phase.

24. The method of claim 18, wherein the semiconductor substrate is contacted with the borane compound for a period of between about 0.1 and 10 seconds.

25. The method of claim 18, wherein the tungsten-containing gas of (b) and (d) has the same composition.

26. The method of claim 18, wherein the tungsten-containing gas of (b) comprises $WF_6$.

27. The method of claim 18, wherein the semiconductor substrate is contacted with the tungsten-containing gas in (b) for a period of between about 0.1 and 10 seconds.

28. The method of claim 18, wherein the layer of reducing agent formed in (c) is a self-limiting layer.

29. The method of claim 18, further comprising repeating (c) and (d) for at least one cycle.

30. The method of claim 29, wherein the duration of contacting with the tungsten-containing gas in an earlier cycle is shorter than the duration of contacting with the tungsten-containing gas in a later cycle.

31. The method of claim 18, wherein the duration of contacting with the tungsten-containing gas in (b) is shorter than the duration of contacting with the tungsten-containing gas in (d).

32. The method of claim 18, further comprising exposing the semiconductor substrate to a pulse of $WF_6$ prior to (a).

* * * * *